US007564982B1

(12) United States Patent  (10) Patent No.: US 7,564,982 B1
Ambourn  (45) Date of Patent: Jul. 21, 2009

(54) TWO CHANNEL AUDIO SURROUND SOUND CIRCUIT

(75) Inventor: Paul R. Ambourn, St. Paul, MN (US)

(73) Assignee: Phantom Technologies, Inc., St. Paul, MN (US)

( * ) Notice: Subject to any disclaimer, the term of this patent is extended or adjusted under 35 U.S.C. 154(b) by 538 days.

(21) Appl. No.: 10/179,786

(22) Filed: Jun. 25, 2002

(51) Int. Cl.
*H03F 21/00* (2006.01)
(52) U.S. Cl. .................... 381/120; 330/252; 381/1
(58) Field of Classification Search ............ 381/1, 381/11, 26–28, 17–23, 120, 301–309, 84, 381/111, 310, 121, 24; 330/251–254, 51, 330/124 R; 84/111, 28
See application file for complete search history.

(56) References Cited

U.S. PATENT DOCUMENTS

| | | | | |
|---|---|---|---|---|
| 4,479,235 A | * | 10/1984 | Griffis | 381/17 |
| 4,495,637 A | | 1/1985 | Bruney | 381/1 |
| 4,536,716 A | * | 8/1985 | Yoshida et al. | 330/69 |
| 4,908,868 A | * | 3/1990 | McTaggart | 381/59 |
| 5,339,067 A | * | 8/1994 | Harris et al. | 338/323 |
| 5,434,921 A | * | 7/1995 | Dombrowski et al. | 381/1 |
| 5,748,745 A | * | 5/1998 | Bedini | 381/1 |
| 5,812,683 A | | 9/1998 | Parker et al. | |
| 5,850,454 A | * | 12/1998 | Hawks | 381/1 |
| 5,963,088 A | * | 10/1999 | Czarnul et al. | 330/69 |
| 6,292,052 B1 | * | 9/2001 | Carlson | 330/9 |
| 6,925,184 B2 | * | 8/2005 | Wang | 381/18 |
| 2006/0215848 A1 | | 9/2006 | Ambourn | |

* cited by examiner

*Primary Examiner*—Vivian Chin
*Assistant Examiner*—Lun-See Lao
(74) *Attorney, Agent, or Firm*—Moore & Hansen, PLLP

(57) ABSTRACT

A two channel surround sound audio circuit (surround sound circuit) includes a first amplifier, a second amplifier, two polarized input capacitors, and two polarized output capacitors. A first input line is coupled through one polarized input capacitor to a positive terminal of the second amplifier and to a negative terminal of the first amplifier. A second input line is coupled through the other polarized input capacitor to a positive terminal of the first amplifier and to a negative terminal of the second amplifier. The output of the first and second amplifier are connected to the first and second polarized output capacitors, respectively. A second embodiment of the surround sound circuit includes two amplifiers, two inverting amplifiers, and two balancing potentiometers. The output of a single amplifier is balanced with the output of a single inverting amplifier with a single balancing potentiometer.

30 Claims, 2 Drawing Sheets

TWO CHANNEL AUDIO SURROUND SOUND CIRCUIT

BACKGROUND OF THE INVENTION

1. Field of the Invention

The present invention relates generally to surround sound processors and more specifically to a two channel audio surround sound circuit that is less complicated and more economical than that of the prior art.

2. Discussion of the Prior Art

Surround sound processors are normally used to decode surround sound audio signals which are recorded on the sound tracks of video cassettes and discs. Surround sound processors will also enhance the imaging of audio recordings. However, these surround sound processors use complicated circuitry to create a three dimensional sound field using as many as five speakers. The five speakers create a three dimensional sound field similar to that found in a modern movie theater.

However, there have been at least two patents directed at producing surround sound audio from two channels or two speakers. U.S. Pat. No. 4,495,637 to Bruney discloses an apparatus and method for enhanced psychoacoustic imagery using asymmetric cross-channel feed. However, the one microfarad input and output capacitors will act as low pass filters and provide poor frequency response in lower frequencies in the symmetrical circuit. U.S. Pat. No. 5,434,921 to Dombroski, Jr. et al. discloses a stereo image control circuit. However, numerous active components are required for the stereo image control circuit.

Accordingly, there is a clearly felt need in the art for a two channel surround sound audio circuit that provides a robust low frequency response with improved imaging, and has a less complicated design than that of the prior art.

SUMMARY OF THE INVENTION

The present invention provides a two channel surround sound audio circuit that provides improved imaging with a robust low frequency response. The two channel surround sound audio circuit (surround sound circuit) includes a first amplifier, a second amplifier, two polarized input capacitors, and two polarized output capacitors. A first input line is coupled to a positive terminal of the second amplifier through one of the two polarized input capacitors. The first input line is also coupled to the input of the negative terminal of the first amplifier through the one of the two polarized input capacitors. A second input line is coupled to a positive terminal of the first amplifier through a second of the two polarized input capacitors. The second input line is also coupled to the negative terminal of the second amplifier through the second of two polarized input capacitors. The output of the first amplifier is connected to one of the two polarized output capacitors and the output of the second amplifier is connected to a second of the two polarized output capacitors. Each output capacitor is preferably connected to a single headphone transducer or to one input channel of a power amplifier.

A second embodiment of a surround sound circuit includes a first amplifier, a second amplifier, a first inverting amplifier, a second inverting amplifier, a first balancing potentiometer, and a second balancing potentiometer. A first input line is coupled to a negative terminal of the first amplifier and a positive terminal of a second amplifier. The first input line is also coupled to the first inverting amplifier. A second input line is coupled to a negative terminal of the second amplifier and a positive terminal of the first amplifier. The second input line is also coupled to the second inverting amplifier. The output of the first amplifier and the first inverting amplifier are connected to opposing ends of the first balancing potentiometer. The output of the second amplifier and the second inverting amplifier are connected to opposing ends of the second balancing potentiometer. A tap of each balancing potentiometer is preferably connected to a single headphone transducer or to one input channel of a power amplifier.

Accordingly, it is an object of the present invention to provide a surround sound circuit having a robust lower frequency response with improved imaging.

Finally, it is another object of the present invention to provide a surround sound circuit having a less complicated design than that of the prior art.

These and additional objects, advantages, features and benefits of the present invention will become apparent from the following specification.

DETAILED DESCRIPTION OF THE PREFERRED EMBODIMENTS

Figure 1:
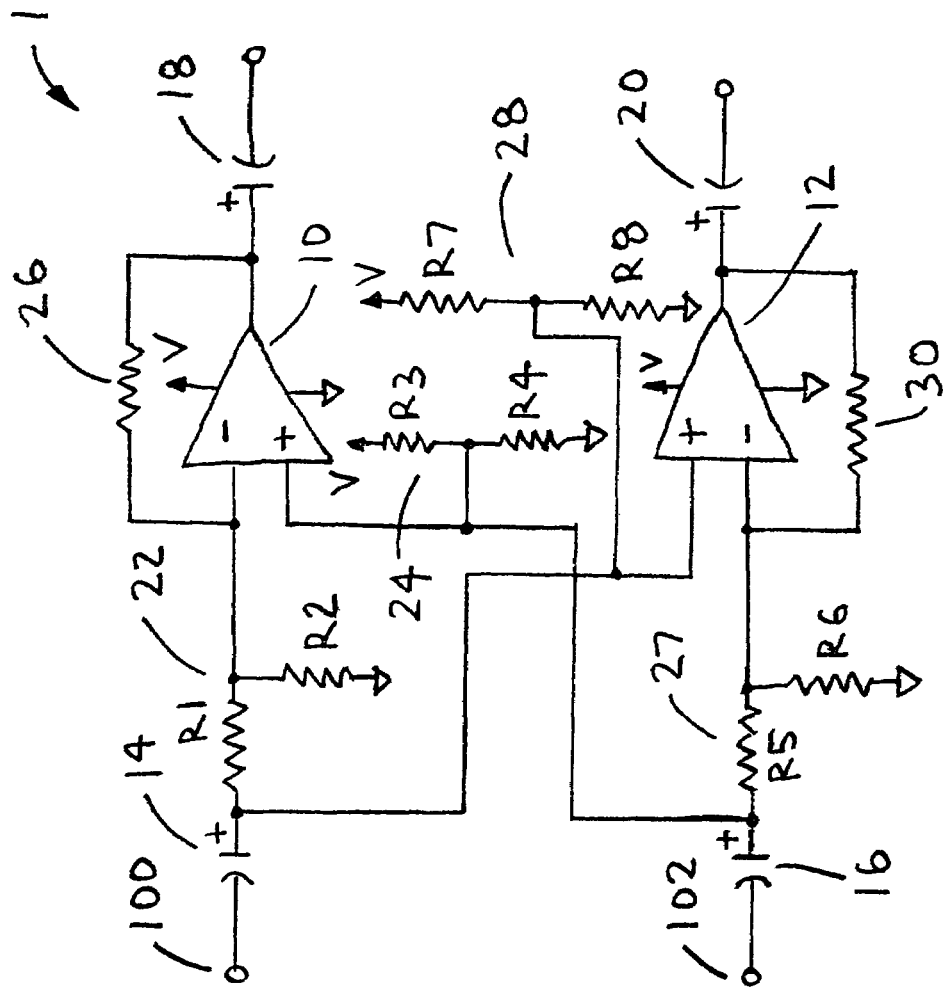
FIG. 1 is a surround sound circuit in accordance with the present invention.
Figure 2:
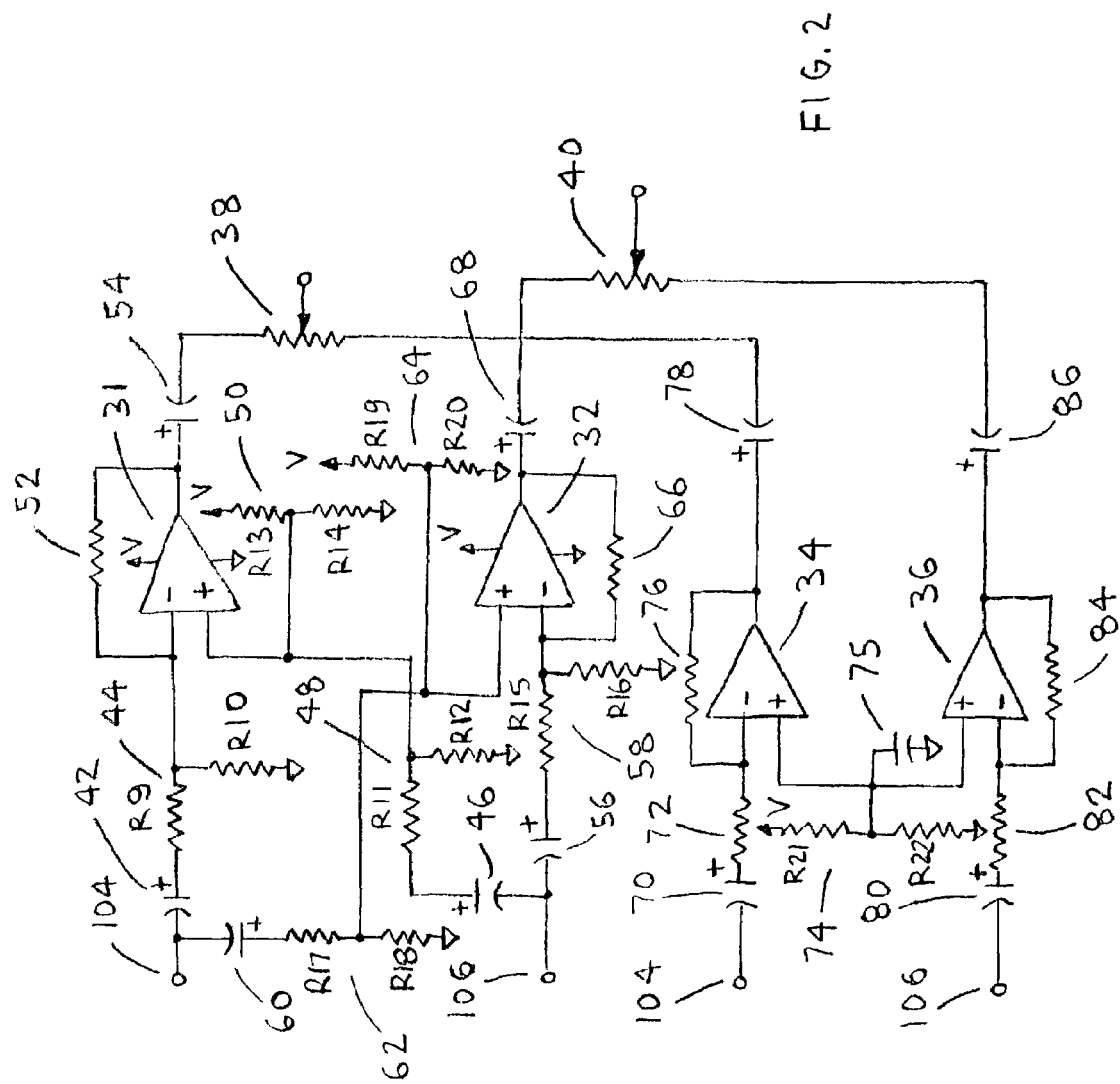
FIG. 2 is a second embodiment of a surround sound circuit in in accordance with the present invention.

With reference now to the drawings, and particularly to FIG. 1, there is shown a surround sound circuit 1. The surround sound circuit 1 includes a first amplifier 10, a second amplifier 12, a first polarized input capacitor 14, a second polarized input capacitor 16, a first polarized output capacitor 18, and a second polarized output capacitor 20. A first input line 100 is coupled to a negative terminal of the first amplifier 10 through the first polarized input capacitor 14 and a first voltage divider 22. The first voltage divider 22 includes resistors R1 and R2. A second input line 102 is connected to a positive terminal of the second amplifier 12 through the second polarized input capacitor 16. The polarity of the first polarized input capacitor 14 is reversed from the first polarized output capacitor 18. A first pull-up divider 24 is used to pull-up the positive terminal of the first amplifier 10. The first pull-up divider 24 includes resistors R3 and R4. A first gain resistor 26 is connected across the first amplifier 10. The output of the first amplifier 10 is connected to the first polarized output capacitor 18.

The second input line 102 is connected to a negative terminal of the second amplifier 12 through the second polarized input capacitor 16 and a second voltage divider 27. The second voltage divider 27 includes resistors R5 and R6. The first input line 100 is connected to a positive terminal of the second amplifier 12 through the first polarized input capacitor 14. The polarity of the second polarized input capacitor 16 is reversed from the second polarized output capacitor 20. A second pull-up divider 28 is used to pull up the positive terminal of the second amplifier 12. The second pull-up divider 28 includes resistors R7 and R8. A second gain resistor 30 is connected across the second amplifier 12. The output of the second amplifier 12 is connected to the second polarized output capacitor 20.

The following values of resistors and capacitors are given by way of example and not by way of limitation. The resistance value of resistors R3, R4, R7 and R8 is preferably 100 kohms. The resistance value of resistors R1 and R5 is preferably 12 kohms. The resistance value of resistors R2 and R6 is preferably 35 kohms. The resistance value of the first and second gain resistors is preferably 11 kohms. The capacitance value of the first and second polarized input capacitors is preferably at least 10 microfarads. The capacitance value of the first and second output capacitors is preferably 220 microfarads.

A second embodiment of a surround sound circuit 2 includes a first amplifier 31, a second amplifier 32, a first inverting amplifier 34, a second inverting amplifier 36, a first balancing potentiometer 38, and a second balancing potentiometer 40. A first input line 104 is connected to a negative terminal of the first amplifier 31 preferably through a first input capacitor 42 and a first voltage divider 44. The first voltage divider 44 includes resistors R9 and R10. A second input line 106 is connected to a positive terminal of the first amplifier 31 through a third input capacitor 46 and a third voltage divider 48. The third voltage divider 48 includes resistors R11 and R12. A first pull-up divider 50 is used to pull up the positive terminal of the first amplifier 31. The first pull-up divider 50 includes resistors R13 and R14. A first gain resistor 52 is connected across the first amplifier 31. The output of the first amplifier 31 is connected to a first output capacitor 54.

The second input line 106 is connected to a negative terminal of the second amplifier 32 preferably through a third input capacitor 56 and a second voltage divider 58. The second voltage divider 58 includes resistors R15 and R16. The first input line 104 is connected to a positive terminal of the second amplifier 32 through a fourth input capacitor 60 and a fourth voltage divider 62. The fourth voltage divider 62 includes resistors R17 and R18. A second pull-up divider 64 is used to pull up the positive terminal of the second amplifier 32. The second pull-up divider 64 includes resistors R19 and R20. A second gain resistor 66 is connected across the second amplifier 32. The output of the second amplifier 32 is connected to a second output capacitor 68.

The first input line 104 is also connected to a negative terminal of the first inverting amplifier 34 preferably through a fifth input capacitor 70 and a first input resistor 72. A third pull-up divider 74 and a pull-up capacitor 75 are connected to a positive terminal of the first and second inverting amplifiers. The third pull-up divider 74 includes resistors R21 and R22. A third gain resistor 76 is connected across the first inverting amplifier 34. A third output capacitor 78 is connected to an output of the first inverting amplifier 34.

The second input line 106 is also coupled to a negative terminal of the second inverting amplifier 36 preferably through a sixth input capacitor 80 and a second input resistor 82. A fourth gain resistor 84 is connected across the second inverting amplifier 36. A fourth output capacitor 86 is connected to an output of the second inverting amplifier 36.

The first output capacitor 54 is connected to one end of the first balancing potentiometer 38 and the third output capacitor 78 is connected to the other end thereof. The second output capacitor 68 is connected to one end of the second balancing potentiometer 40 and the fourth output capacitor 86 is connected to the other end thereof. Adjustment of the wipers of the first and second balancing capacitors modifies the acoustic imaging.

The following values of resistors and capacitors are given by way of example and not by way of limitation. The resistance value of resistors R13, R14, and R19-R22 is preferably 100 kohms. The resistance value of resistors R9 and R15 is preferably 1.5 kohms. The resistance value of resistors R10 and R16 is preferably 43 kohms. The resistance value of resistors R11, R12, R17, and R18 is preferably 2.3 kohms. The resistance value of the first and second gain resistors is preferably 5 kohms. The resistance value of the first and second input resistors is preferably 4 kohms. The resistance value of the third and four gain resistors is preferably 10 kohms. The capacitance value of the first-fourth input capacitors is preferably at least 10 microfarads. The capacitance value of the first-fourth output capacitors is 220 microfarads. Preferably, the input and output capacitors are polarized. Preferably, the polarity of the input capacitors is reversed from the output capacitors.

Each output capacitor of the surround sound circuit 1 is preferably connected to a transducer of a headphone or to a single input channel of a power amplifier. The wiper of each balancing potentiometer is preferably connected to a transducer of a headphone or to a single input channel of a power amplifier. However, the surround sound circuits 1 & 2 may also be used for other electronic applications.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

I claim:

1. A surround sound circuit comprising: only a first non-integrating amplifier and a second non-integrating amplifier and no additional amplifiers;

a first pull-up divider being connected to said positive terminal of said first amplifier, a second pull-up divider being connected to said positive terminal of said second amplifier;

a first polarized input capacitor and a second polarized input capacitor; a first input line being coupled to a negative terminal of said first amplifier through said first polarized input capacitor and a second input line being connected to a positive terminal of said first amplifier through said second polarized input capacitor; said second input line being coupled to a negative terminal of said second amplifier through said second polarized input capacitor and said first input line being connected to a positive terminal of said second amplifier through said first polarized input capacitor; and a first polarized output capacitor being connected to an output of said first amplifier and a second polarized output capacitor being connected to an output of said second amplifier; in which the positive terminals of the first and second non-integrating amplifiers are not connected commonly together, nor are the negative terminals of the first and second non-integrating amplifiers connected commonly together.

2. The surround sound circuit of claim 1, further comprising:

a first voltage divider circuit being connected to said negative terminal of said first amplifier, a first gain resistor being connected across said first amplifier; and a second voltage divider circuit being connected to said negative terminal of said second amplifier, a second gain resistor being connected across said second amplifier.

3. The surround sound circuit of claim 1 wherein:

said first polarized input capacitor having a polarity reversed from said first polarized output capacitor; and said second polarized input capacitor having a polarity reversed from said second polarized output capacitor.

4. The surround sound circuit of claim 1 wherein:

said first and second polarized input capacitors having a value of at least 10 microfarads, said first and second polarized output capacitors having a value of at least 220 microfarads.

5

5. A surround sound circuit comprising:
only a first non-integrating amplifier and a second non-integrating amplifier and no additional amplifiers;
a first pull-up divider being connected to said positive terminal of said first amplifier, a second pull-up divider being connected to said positive terminal of said second amplifier;
a first polarized input capacitor and a second polarized input capacitor, said first and second polarized input capacitors having a value of at least 10 microfarads;
a first input line being coupled to a negative terminal of said first amplifier through said first polarized input capacitor and a second input line being connected to a positive terminal of said first amplifier through said second polarized input capacitor;
said second input line being coupled to a negative terminal of said second amplifier through said second polarized input capacitor and said first input line being connected to a positive terminal of said second amplifier through said first polarized input capacitor; and
a first polarized output capacitor being connected to an output of said first amplifier and a second polarized output capacitor being connected to an output of said second amplifier, said first and second output capacitors having a value of at least 220 microfarads; in which the positive terminals of the first and second non-integrating amplifiers are not connected commonly together, nor are the negative terminals of the first and second non-integrating amplifiers connected commonly together.

6. The surround sound circuit of claim 5, further comprising:
a first voltage divider circuit being connected to said negative terminal of said first amplifier, a first gain resistor being connected across said first amplifier; and
a second voltage divider circuit being connected to said negative terminal of said second amplifier, a second gain resistor being connected across said second amplifier.

7. The surround sound circuit of claim 5 wherein:
said first polarized input capacitor having a polarity reversed from said first polarized output capacitor; and
said second polarized input capacitor having a polarity reversed from said second polarized output capacitor.

8. A surround sound circuit, comprising:
only first and second non-integrating amplifiers, each having a positive input, a negative input, and an output, and no additional amplifiers;
a first pull-up divider being connected to said positive terminal of said first amplifier, a second pull-up divider being connected to said positive terminal of said second amplifier;
a first circuit input connected without amplification or switching to each of the negative input of the first amplifier and the positive input of the second amplifier; a second circuit input connected without amplification or switching to each of the positive input of the first amplifier and the negative input of the second amplifier; in which the positive inputs of the first and second non-integrating amplifiers are not connected commonly together, nor are the negative terminals of the first and second non-integrating amplifiers connected commonly together; first and second polarized input capacitors, in which the first polarized input capacitor is connected between the first circuit input and the negative input of the first amplifier, and the second polarized input capacitor is connected between the second circuit input and the negative input of the second amplifier; and

6 first and second polarized output capacitors, in which the first polarized output capacitor is connected to the output of the first amplifier and the second polarized output capacitor is connected to the output of the second amplifier.

9. The surround sound circuit of claim 8, in which each of the first and second polarized input capacitors has a value of at least 10 microfarads.

10. The surround sound circuit of claim 8, in which the first polarized input capacitor has a reversed polarity relative to the first polarized output capacitor, and the second polarized input capacitor has a reversed polarity relative to the second polarized output capacitor.

11. The surround sound circuit of claim 8, in which each of the first and second polarized output capacitors has a value of at least 220 microfarads.

12. The surround sound circuit of claim 8, further comprising first and second gain resistors connected across respective first and second amplifiers.

13. The surround sound circuit of claim 8, further comprising first and second voltage dividers, in which the first voltage divider is connected to the negative input of the first amplifier, and the second voltage divider is connected to the negative input of the second amplifier.

14. A method of providing only two surround sound outputs from only first and second inputs, comprising: providing only first and second non-integrating amplifiers, each having a positive input, a negative input, and one of the two surround sound outputs, and no additional amplifiers;
a first pull-up divider being connected to said positive terminal of said first amplifier, a second pull-up divider being connected to said positive terminal of said second amplifier;
cross-coupling each of the first and second inputs to both the positive input of one of the first and second amplifiers and the negative input of the other of the first and second amplifiers such that the positive inputs of the first and second non-integrating amplifiers are not connected commonly together, nor are the negative terminals of the first and second non-integrating amplifiers connected commonly together; and providing capacitance on each of the first and second inputs and each of the surround sound outputs.

15. The method of claim 14, in which the capacitance provided on each of the first and second inputs is at least 10 microfarads.

16. The method of claim 14, in which the capacitances provided on the first and second inputs have reversed polarity relative to the capacitances provided on each of the surround sound outputs.

17. The method of claim 14, in which the capacitance provided on each of the surround sound outputs is at least 220 microfarads.

18. The method of claim 14, further comprising controlling the gain of at least one of the first and second amplifiers.

19. The method of claim 14, further comprising pulling up voltage on the positive input of at least one of the first and second amplifiers.

20. A surround sound circuit, consisting essentially of:
only first and second non-integrating amplifiers, each having a positive input, a negative input, and an output, and no additional amplifiers;
a first circuit input connected without amplification or switching to each of the negative input of the first amplifier and the positive input of the second amplifier;

a second circuit input connected without amplification or switching to each of the positive input of the first amplifier and the negative input of the second amplifier;

in which the positive inputs of the first and second non-integrating amplifiers are connected commonly together, nor are the negative terminals of the first and second non-integrating amplifiers connected commonly together;

first and second polarized input capacitors, in which the first polarized input capacitor is connected between the first circuit input and the negative input of the first amplifier, and the second polarized input capacitor is connected between the second circuit input and the negative input of the second amplifier; and first and second polarized output capacitors, in which the first polarized output capacitor is connected to the output of the first amplifier and the second polarized output capacitor is connected to the output of the second amplifier;

first and second pull-up dividers connected to respective positive inputs of the first and second amplifiers; and first and second voltage dividers, in which the first voltage divider is connected to the negative input of the first amplifier, and the second voltage divider is connected to the negative input of the second amplifier.

21. The surround sound circuit of claim 20, in which each of the first and second polarized input capacitors has a value of at least 10 microfarads.

22. The surround sound circuit of claim 20, in which the first polarized input capacitor has a reversed polarity relative to the first polarized output capacitor, and the second polarized input capacitor has a reversed polarity relative to the second polarized output capacitor.

23. The surround sound circuit of claim 20, in which each of the first and second polarized output capacitors has a value of at least 220 microfarads.

24. A method of providing only two surround sound outputs from only first and second inputs, consisting essentially of:

providing only first and second non-integrating amplifiers, each having a positive input, a negative input, and one of the two surround sound outputs, and no additional amplifiers;

a first pull-up divider being connected to said positive terminal of said first amplifier, a second pull-up divider being connected to said positive terminal of said second amplifier;

cross-coupling each of the first and second inputs to both the positive input of one of the first and second amplifiers and the negative input of the other of the first and second amplifiers such that the positive inputs of the first and second non-integrating amplifiers are connected commonly together, nor are the negative terminals of the first and second non-integrating amplifiers connected commonly together; and providing capacitance on each of the first and second inputs and each of the surround sound outputs.

25. The method of claim 24, in which the capacitance provided on each of the first and second inputs is at least 10 microfarads.

26. The method of claim 24, in which the capacitances provided on the first and second inputs have reversed polarity relative to the capacitances provided on each of the surround sound outputs.

27. The method of claim 24, in which the capacitance provided on each of the surround sound outputs is at least 220 microfarads.

28. A surround sound circuit comprising: only a first inverting amplifier and a second inverting amplifier and no additional amplifiers;

a first pull-up divider being connected to said positive terminal of said first amplifier, a second pull-up divider being connected to said positive terminal of said second amplifier;

a first polarized input capacitor and a second polarized input capacitor; a first input line being coupled to a negative terminal of said first amplifier through said first polarized input capacitor and a second input line being connected to a positive terminal of said first amplifier through said second polarized input capacitor; said second input line being coupled to a negative terminal of said second amplifier through said second polarized input capacitor and said first input line being connected to a positive terminal of said second amplifier through said first polarized input capacitor; and a first polarized output capacitor being connected to an output of said first amplifier and a second polarized output capacitor being connected to an output of said second amplifier; in which the positive terminals of the first and second inverting amplifiers are not connected commonly together, nor are the negative terminals of the first and second non-integrating amplifiers connected commonly together.

29. A method of providing only two surround sound outputs from only first and second inputs, comprising: providing only first and second inverting amplifiers, each having a positive input, a negative input, and one of the only two surround sound outputs, and no additional amplifiers;

a first pull-up divider being connected to said positive terminal of said first amplifier, a second pull-up divider being connected to said positive terminal of said second amplifier;

cross-coupling each of the first and second inputs to both the positive input of one of the first and second inverting amplifiers and the negative input of the other of the first and second inverting amplifiers such that the positive inputs of the first and second non-integrating amplifiers are not connected commonly together, nor are the negative terminals of the first and second non-integrating amplifiers connected commonly together; and providing capacitance on each of the first and second inputs and each of the surround sound outputs.

30. A surround sound circuit, consisting essentially of:

only first and second inverting amplifiers, each having a positive input, a negative input, and an output, and no additional amplifiers;

a first circuit input connected without amplification to each of the negative input of the first inverting amplifier and the positive input of the second inverting amplifier;

a second circuit input connected without amplification to each of the positive input of the first inverting amplifier and the negative input of the second inverting amplifier;

in which the positive inputs of the first and second inverting amplifiers are not connected commonly together, nor are the negative terminals of the first and second non-integrating amplifiers connected commonly together;

first and second polarized input capacitors, in which the first polarized input capacitor is connected between the first circuit input and the negative input of the first inverting amplifier, and the second polarized input capacitor is connected between the second circuit input and the negative input of the second inverting amplifier; and first and second polarized output capacitors, in which the first polarized output capacitor is connected to the output of the first inverting amplifier and the second polarized output capacitor is connected to the output of the second inverting amplifier;

first and second pull-up dividers connected to respective positive inputs of the first and second inverting amplifiers; and first and second voltage dividers, in which the first voltage divider is connected to the negative input of the first inverting amplifier, and the second voltage divider is connected to the negative input of the second inverting amplifier.

* * * * *